(12) United States Patent
Tanaka

(10) Patent No.: US 7,474,166 B2
(45) Date of Patent: Jan. 6, 2009

(54) PLL FREQUENCY SYNTHESIZER CIRCUIT AND FREQUENCY TUNING METHOD THEREOF

(75) Inventor: Toshiyuki Tanaka, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 468 days.

(21) Appl. No.: 11/094,144

(22) Filed: Mar. 31, 2005

(65) Prior Publication Data
US 2005/0218947 A1    Oct. 6, 2005

(30) Foreign Application Priority Data
Mar. 31, 2004    (JP)    ............... 2004-104098

(51) Int. Cl.
*H03B 1/00*    (2006.01)
(52) U.S. Cl. .................. 331/177 V; 331/185; 331/167
(58) Field of Classification Search ............... 331/185, 331/177 V, 117 FE, 117 R, 167
See application file for complete search history.

(56) References Cited

U.S. PATENT DOCUMENTS

| 6,445,257 | B1 * | 9/2002 | Cox et al. | ............... | 331/117 R |
| 6,686,804 | B1 | 2/2004 | Adams et al. | ................. | 331/17 |
| 6,774,736 | B1 * | 8/2004 | Kwek et al. | ............. | 331/177 V |
| 7,005,936 | B2 * | 2/2006 | Tanzawa | ...................... | 331/176 |
| 2003/0042985 | A1 | 3/2003 | Shibahara et al. | ............. | 331/17 |
| 2003/0216130 | A1 | 11/2003 | Dhuna | ........................ | 455/260 |

FOREIGN PATENT DOCUMENTS

| EP | 0 910 170 A2 | 4/1999 |
| EP | 1 261 126 A2 | 11/2002 |
| EP | 1 460 762 A1 | 9/2004 |
| JP | 2001-352218 | 12/2001 |

OTHER PUBLICATIONS

Rachedine, M. et al.: "Performance Review of Integrated CMOS VCO Circuits for Wireless Communications", 2003 IEEE Radio Frequency Integrated Circuits Symposium, Digest of Papers, Philadelphia, PA, Jun. 8-10, 2003, pp. 77-80, XP010646599.
Emad Hagazi et al., "A filtering technique to lower Oscillator Phase Noise," Analog Techniques Lecture No. 4, ISSCC (International Solid-state Circuits Conference), 2001, Session 23, pp. 364-365, 465.

* cited by examiner

*Primary Examiner*—Arnold Kinkead
(74) *Attorney, Agent, or Firm*—Young & Thompson

(57) ABSTRACT

A PLL frequency synthesizer circuit includes a voltage-controlled oscillator circuit provided with a capacitor, an inductor, and a variable capacitor element oscillating using the resonance frequencies of the capacitor and inductor, for outputting the oscillation frequency signal of a variable capacitor element, a negative feedback loop circuit capable of looping the signal output from the voltagecontrolled oscillator circuit and performing a frequency acquisition operation for adjusting the frequency of the signal to a desired locking frequency, a tuning circuit for performing tuning so that the oscillation frequency approaches the locking frequency, by modulating the capacitance value of the capacitor of the voltage-controlled oscillator circuit prior to the frequency acquisition operation, and a reference potential application circuit for applying a reference potential to the variable capacitor element of the voltage-controlled oscillator circuit during the tuning operation performed by the tuning circuit.

17 Claims, 12 Drawing Sheets

RELATED ART

PLL FREQUENCY SYNTHESIZER CIRCUIT AND FREQUENCY TUNING METHOD THEREOF

BACKGROUND OF THE INVENTION

1. Field of the Invention

The present invention relates to a PLL frequency synthesizer circuit and to a frequency tuning method thereof.

2. Description of the Related Art

New features are added to miniature mobile wireless devices such as mobile telephones with the advent of each new model thereof, and certain limits are imposed on the external dimensions of the apparatus, and on the weight and price thereof. Therefore, miniaturization/weight reduction/cost reduction is desired for the components used in these devices.

A circuit referred to as a PLL frequency synthesizer for reference signal generation is usually used for sending and receiving a signal in the wireless unit of a mobile wireless device.

A PLL frequency synthesizer circuit is a circuit provided with functionality for the automatic modulation of an oscillation frequency, and the signal that is output by the PLL frequency synthesizer circuit after automatic modulation is used as the reference signal.

It has been quite common in the past for a PLL frequency synthesizer to be composed of an IC obtained by integrating a voltage controlled oscillator circuit (VCO: Voltage Controlled Oscillator) in which a circuit is modularized in a discrete component, a low-pass filter circuit (LPF circuit: Low Pass Filter) composed of discrete components, and other circuits.

In order to reduce the mounting surface area of a PLL frequency synthesizer on the substrate of a wireless unit, frequent attempts have been made in recent years to mount on a semiconductor integrated circuit a voltage controlled oscillator circuit and low-pass filter circuit, which are difficult to mount inside an IC by conventional techniques.

The conventional PLL frequency synthesizer circuit will be described in further detail below.

<Description of the Basic Structure and Operation of a PLL Frequency Synthesizer>

FIG. 9 is a block diagram showing the structure of a common PLL frequency synthesizer circuit.

The PLL frequency synthesizer circuit depicted in FIG. 9 is composed of a feedback loop made up of the phase comparison circuit 901, the low-pass filter (LPF) circuit 902, the voltage controlled oscillator circuit 903, and the divider circuit 904. The oscillation output 908 thereof is used as the reference signal of the transmitter circuit and the receiver circuit of the wireless communication circuit.

The phase comparison circuit 901 detects the phase difference between the reference signal 905 output by the PLL frequency synthesizer and the output 909 of the divider circuit 904, and outputs a current or voltage 906 that is proportional to this phase difference.

The low-pass filter circuit 902 supplies the voltage controlled oscillator circuit 903 with a signal 907 obtained by removing the high-frequency component from the output 906 of the phase comparison circuit 901.

The divider circuit 904 feeds back to the phase comparison circuit 901 a signal 909 obtained by substituting the frequency of the output 908 of the voltage controlled oscillator circuit 903 into the expression 1/N (N division).

In this type of PLL frequency synthesizer circuit, the phase of the signal 909 is modulated so that the output 906 of the phase comparison circuit 901 is zero.

The frequency of the oscillation output 908 in a steady state thereby becomes the $N^{th}$ multiple of the frequency of the reference signal 905.

<Description of the Structure and Operation of a CMOS VCO (Voltage Controlled Oscillator Circuit)>

It was mentioned above that in order to reduce the mounting surface area of a PLL frequency synthesizer on the substrate of a wireless unit, frequent attempts have been made in recent years to mount on a semiconductor integrated circuit a voltage controlled oscillator circuit and low-pass filter circuit, which are difficult to mount inside an IC by conventional techniques.

FIGS. 10 through 12 are circuit diagrams showing the voltage controlled oscillator circuit composed of CMOS transistors described by Abidi et al. of UCLA in "A Filtering Technique to Lower Oscillator Phase Noise," Analog Techniques Lecture No. 4, ISSCC (International Solid-state Circuits Conference) 2001, Session 23.

FIG. 10 shows the base circuit thereof.

The base circuit shown in FIG. 10 is provided with the first and second inductors 1001 and 1002, the first and second variable capacitor elements 1003 and 1004, and the first through third NMOS transistors 1005, 1006, and 1007.

In the circuit shown in FIG. 10, NMOS transistors 1005 and 1006 are used as active elements for obtaining negative resistance, and a MOS capacitor that uses the space between a gate and a back gate made up of the NMOS transistors 1003 and 1004 is used as a variable capacitor element. The capacitance values of the NMOS transistors 1003 and 1004 are equivalent to each other, and the inductor values of the inductors 1001 and 1002 are equivalent to each other.

In the oscillator circuit of FIG. 10, if Cv is the capacity of the NMOS transistor 1003 or the NMOS transistor 1004, and L1 is the inductor value of the first inductor 1001 or the second inductor 1002, then the parallel frequency of Cv and L becomes the oscillation frequency fvco1, which is found from equation (1).

$$fvco1 = 1/(2 \cdot \pi \cdot (L1 \cdot Cv)^{1/2}) \qquad \text{Equation (1)}$$

In FIG. 11, in order to widen the oscillation frequency range, the base circuit in FIG. 10 is provided with capacitor switching circuits (Tuning Capacitor circuits) 1011 and 1012 provided with variable capacitor elements corresponding to the NMOS transistors 1003 and 1004.

In FIG. 11, the capacitor switching circuits 1011 and 1012 are each configured as shown in FIG. 12, and the variable capacitor element 1021 corresponds to the NMOS transistor 1003 or 1004 in FIG. 10. The capacitor switching circuits 1011 and 1012 are provided with a variable capacitor element 1021; capacitors 1022, 1023, and 1024 whose capacitance values are weighted C, 2C, and 4C, respectively; and NMOS transistors 1025, 1026, and 1027. The parallel capacity Cvp composed of the variable capacitor element 1021 and the capacitors 1022, 1023, and 1024 can be varied in a wide range by controlling whether the capacitors 1022, 1023, and 1024 are grounded or not grounded (GND) according to the "on" or "off" state of the NMOS transistors 1025, 1026, and 1027. By varying the control voltage Vc applied to the back gate of the variable capacitor element 1021, the parallel capacity Cvp composed of the variable capacitor element 1021 and the capacitors 1022, 1023, and 1024 can be finely adjusted. If the relationship between the range ΔCvp of the Vc-induced capacity variation of the variable capacitor element 1021 and the capacitance value C of the capacitor 1022 is set such that C<ΔCvp, then the resonance frequency of the inductor 1001 and the capacitor switching circuit 1011, and the resonance frequency of the inductor 1002 and the capacitor switching circuit 1012 can vary continuously, and the oscillation frequency fvco2 can also vary continuously. It therefore becomes possible for fvco2 to vary in a wider frequency range than the circuit in FIG. 10, and if L2 is the inductor value of the inductors 1001 and 1002, then fvco2 is found according to equation (2).

$$fvco2 = 1/(2 \cdot \pi \cdot (L2 \cdot Cvp)^{1/2})$$ Equation (2)

In Japanese Unexamined Patent Application Publication No. 2001-352218, an example of a configuration in which the capacitor switching circuit in FIG. 13 is configured using only a variable capacitor element is described as a mechanism for varying the oscillation frequency of a CMOS VCO in a wide range.

Specifically, as shown in FIG. 13, the circuit in this example is provided with a plurality of variable capacitor elements 1111, 1112, 1113, and 1114; frequency control terminals 1121, 1122, 1123, and 1124 that correspond on a one-to-one basis to the variable capacitor elements 1111 through 1114, respectively; a resonance circuit 1101; a negative resistance circuit 1102; and a transmission output terminal 1103. A function equivalent to that of the capacitor switching circuit in the circuit of FIG. 11 can be performed by switching the bias potential applied to the frequency control terminals 1121 through 1124 to the maximum potential and minimum potential at which the capacity variation of each of the variable capacitor elements 1111 through 1114 corresponding thereto is saturated.

However, in a PLL frequency synthesizer circuit that uses a VCO whereby the frequency can vary in a wide range by the switching of capacitors in the type of capacitor resonance circuit shown in FIGS. 10 through 13, a mechanism must be provided for retrieving the set value of the switched capacitor in advance so that the frequency for which locking in the range of the VCO oscillation frequency is desired exists prior to the frequency lock operation of the PLL loop.

The VCO circuit shown in FIG. 13 also uses an N-Well capacitor, which is a type of MOS capacitor, in the variable capacitor element for adjusting the oscillation frequency of the VCO. A detailed description of the method for correcting fluctuations in the characteristics of the N-Well capacitor is found in paragraph Nos. 23 and 24, FIGS. 3, 4, and 5, and elsewhere in this related patent application.

Specifically, the following description is given in paragraph No. 23 of the related patent application: "For example, a constant voltage determined in advance is applied from the frequency control terminal 8 during the factory shipping inspection, and unevenness in the frequency due to fluctuations in manufacturing can be corrected." However, in a method for applying a constant voltage to the control terminal, situations can be envisioned in which this constant voltage becomes equal to the electrical potential at which the capacity variation characteristics of the N-Well capacitor are saturated due element variance, and this method may not be considered suitable for large-scale production.

Paragraph No. 24 of the related patent application also describes an example of a method whereby the frequency is monitored by a counter or the like, and the result thereof is fed back to the control voltage output by the frequency correction signal generating circuit, but when the characteristic variance of the N-Well capacitor is large, it is highly likely that errors (unevenness) in the oscillation frequency could exceed the range of correction obtained merely by adjusting the potential applied to a single N-Well capacitor.

The present invention was developed in order to overcome such drawbacks as those described above, and an object of the present invention is to provide a PLL frequency synthesizer circuit and a frequency tuning method thereof whereby the oscillation frequency of a voltage controlled oscillator circuit can be caused to approach a desired lock frequency more reliably than by the conventional technique.

SUMMARY OF THE INVENTION

According to one aspect of the present invention, there is provided a PLL frequency synthesizer circuit integrated on a semiconductor integrated circuit, comprising a voltage-controlled oscillator circuit provided with a capacitor, an inductor, and a variable capacitor element for oscillating using the resonance frequencies of the capacitor and inductor, for outputting the oscillation frequency signal of a variable capacitor element, a negative feedback loop circuit configured to comprise the voltage-controlled oscillator circuit, capable of looping the signal output from the voltage-controlled oscillator circuit and performing a frequency acquisition operation for adjusting the frequency of the signal to a desired locking frequency, a tuning circuit for performing tuning so that the oscillation frequency approaches the locking frequency, by modulating the capacitance value of the capacitor of the voltage-controlled oscillator circuit prior to the frequency acquisition operation, and a reference potential application circuit for applying a reference potential to the variable capacitor element of the voltage-controlled oscillator circuit during the tuning operation performed by the tuning circuit.

By the PLL frequency synthesizer circuit according to this invention, the reference voltage generating circuit 608 is provided for applying a reference potential to the variable capacitor elements of the VCO during the tuning operation performed by the VCO automatic tuning circuit, it therefore becomes possible to cause the aforementioned oscillation frequency to approach the desired locking frequency by the tuning operation more reliably than by the conventional circuit.

According to another aspect of the present invention, there is provided a method for tuning the oscillation frequency of a PLL frequency synthesizer circuit comprising a voltage-controlled oscillator circuit provided with a capacitor, an inductor, and a variable capacitor element for oscillating using the resonance frequencies of the capacitor and inductor, for outputting the oscillation frequency signal of a variable capacitor element and a negative feedback loop circuit configured to comprise the voltage-controlled oscillator circuit, capable of looping the signal output from the voltage-controlled oscillator circuit and performing a frequency acquisition operation for adjusting the frequency of the signal to a desired locking frequency; the frequency tuning method for a PLL frequency synthesizer circuit, the method comprising performing a first tuning such that the oscillation frequency approaches the locking frequency, by modulating the capacitance value of the capacitor of the voltage-controlled oscillator circuit in a state in which one of the two types of electrical potentials is applied to the variable capacitor element of the voltage-controlled oscillator circuit and performing a second tuning such that the oscillation frequency approaches the locking frequency, by modulating the capacitance value of the capacitor of the voltage-controlled oscillator circuit in a state in which the other of the two types of electrical potentials is applied to the variable capacitor element of the voltage-controlled oscillator circuit, these steps being performed prior to the frequency acquisition operation.

By the method for tuning the oscillation frequency of PLL frequency synthesizer circuit according to this invention, the reference voltage generating circuit 608 is provided for applying a reference potential to the variable capacitor elements of the VCO during the tuning operation performed by the VCO automatic tuning circuit, it therefore becomes possible to cause the aforementioned oscillation frequency to approach the desired locking frequency by the tuning operation more reliably than by the conventional method.

BRIEF DESCRIPTION OF THE DRAWINGS

The above and other objects, advantages and features of the present invention will be more apparent from the following description taken in conjunction with the accompanying drawings, in which:

FIGS. 6A and 6B are diagrams showing the variable capacitor element (MOS capacitor) of the voltage controlled oscillator circuit (VCO), wherein FIG. 6A is a diagram that uses symbols, and FIG. 6B is a schematic structural diagram;

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
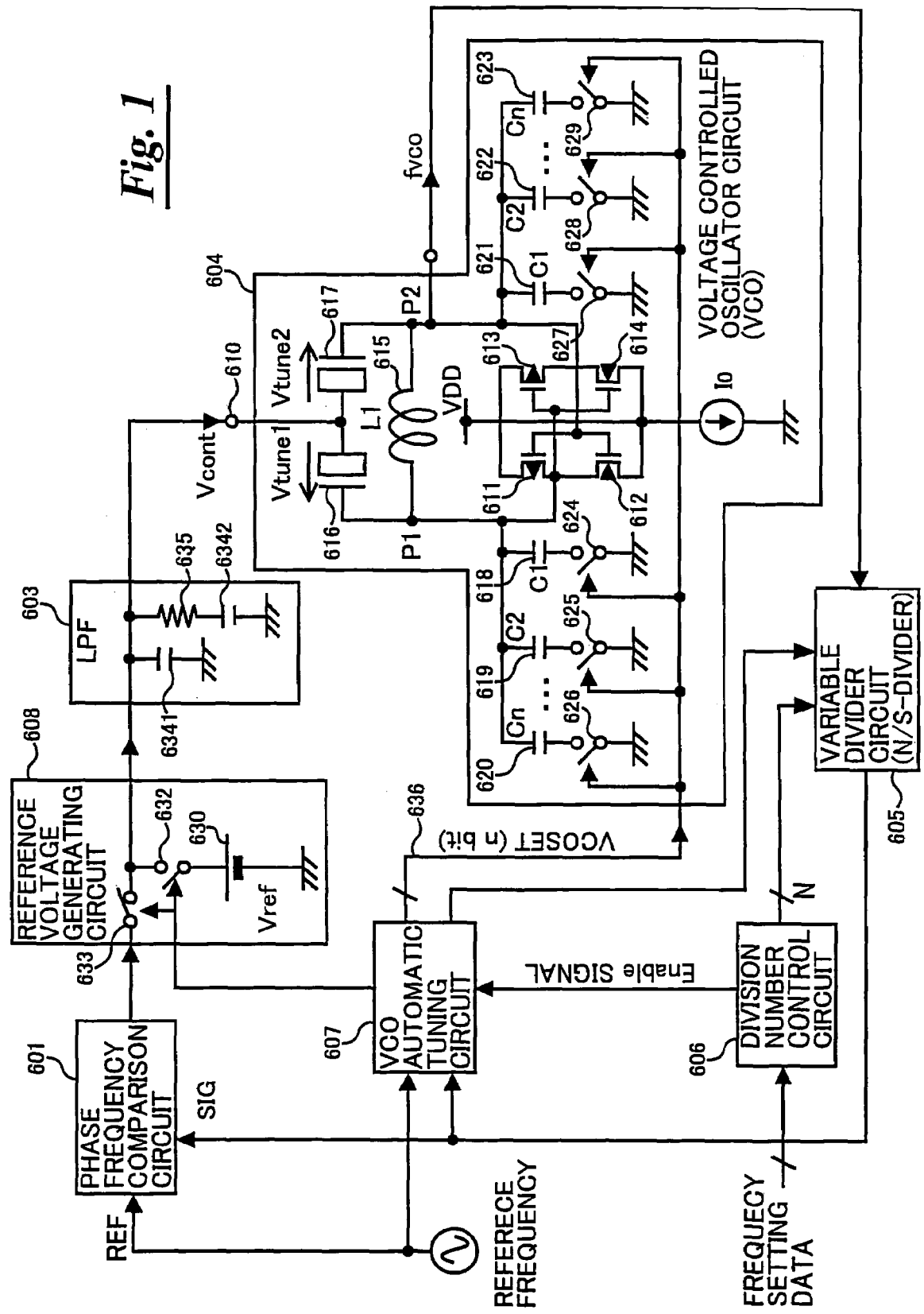
FIG. 1 is a circuit diagram showing the PLL frequency synthesizer circuit according to a first embodiment of the present invention.

FIG. 1 is a circuit diagram showing the PLL frequency synthesizer circuit according to a first embodiment of the present invention, and is also a diagram of the circuit that forms the basis of the second embodiment, described hereinafter.

As shown in FIG. 1, the PLL frequency synthesizer circuit according to the present embodiment is composed of a negative feedback loop made up of the phase frequency comparison circuit 601, the low-pass filter circuit (hereinafter abbreviated as "LPF circuit") 603, the voltage controlled oscillator circuit (hereinafter abbreviated as "VCO") 604, the variable divider circuit 605, the division number control circuit 606, the VCO automatic tuning circuit (tuning means) 607, and the reference voltage generating circuit (reference potential application means) 608, and these components are integrated on a semiconductor integrated circuit (not shown).

Among these components, the phase frequency comparison circuit 601 outputs a current or voltage that is proportional to the phase difference or frequency difference between the signal REF of the reference frequency and the output signal SIG of the variable divider circuit 605.

The reference voltage generating circuit 608 comprises a reference voltage source 630, and switches 632 and 633 that operate in opposite states from each other, and has functionality whereby an electrical potential Vref at one point in the area in which the capacitor pair voltage characteristics of the variable capacitor elements 616 and 617 (described hereinafter) of the VCO 604 vary in linear fashion can be supplied to the LPF circuit 603 and VCO 604.

In the reference voltage source 630 among these components, one end thereof is grounded, and the other end is connected to the switch 632.

The switch 632 switches between a state of connection between the reference voltage source 630 and the LPF circuit 603 (and the VCO 604 ahead of it) and a state of disconnection between these components, under the control of the VCO automatic tuning circuit 607.

The switch 633 switches between a state of connection between the output of the phase frequency comparison circuit 601 and the LPF circuit 603 (and the VCO 604 ahead of it) and a state of disconnection between these components, under the control of the VCO automatic tuning circuit 607.

In this arrangement, in a steady state (a state in which the PLL frequency synthesizer circuit is locked to the desired frequency), a condition exists in which the switch 633 is closed (a state in which the phase frequency comparison circuit 601 and the LPF circuit 603 are connected to each other), and the switch 632 is open (a state in which the reference voltage source 630 and the LPF circuit 603 are disconnected from each other) Therefore, in a steady state, the output of the phase frequency comparison circuit 601 passes on through the reference voltage generating circuit 608 and is fed to the LPF circuit 603 without modification.

The LPF circuit 603 is provided with capacitors 6341 and 6342, and a resistor 635. In the capacitor 6341 among these components, one end thereof is grounded, and the other end is connected to the reference voltage generating circuit 608 and one end of the resistor 635. The other end of the resistor 635 is connected to one end of the capacitor 6342, and the other end of the capacitor 6342 is grounded. Furthermore, the abovementioned one end of the resistor 635 is also connected to the terminal 610 of the VCO 604.

The LPF circuit 603 thus configured removes the alternating current component from the output signal of the phase frequency comparison circuit 601, and presents the terminal 610 of the VCO 604 with a voltage signal Vcont for controlling the oscillation frequency.

The VCO 604 is an LC-type oscillator circuit that uses a reverse inverter circuit made up of a combination of PMOS transistors and NMOS transistors in a negative resistance circuit.

Among these components, those that correspond to the reverse inverter circuit are the combination of the PMOS transistor 611 and the NMOS transistor 612, and the combination of the PMOS transistor 613 and the NMOS transistor 614.

The LC resonance circuit for varying the oscillation frequency is made up of n (6, for example) capacitor arrays composed of an inverter 615; variable capacitor elements 616 and 617; capacitors 618, 619, 620, 621, 622, and 623 having weighted capacitance values; and switches 624, 625, 626, 627, 628, and 629.

Among these components, fine adjustment of the frequency is performed by the variable capacitor elements 616 and 617, and the frequency can be varied in a wide range by the capacitor array. In this arrangement, MOS capacitors are used for the variable capacitor elements 616 and 617 if the usual CMOS process is used. Specifically, FIG. 1 depicts an example in which the MOS capacitors shown in FIG. 6A/6B (structure) and FIG. 7 (characteristics) are used as the variable capacitor elements 616 and 617.

Figure 6A:
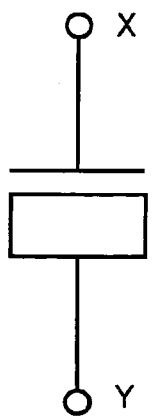
Figure 7:
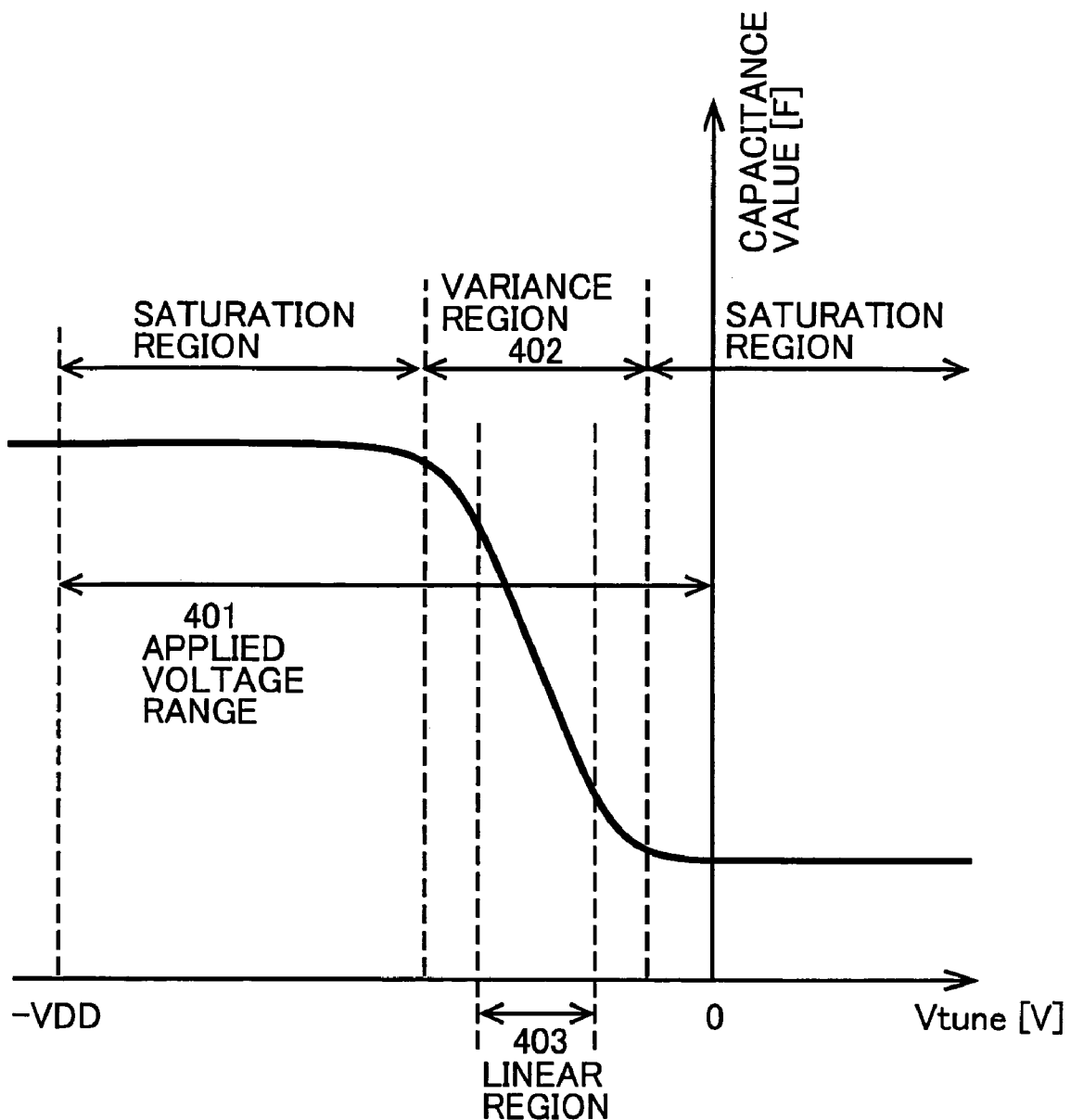
FIG. 7 is a diagram showing the voltage characteristics (C-V characteristics) of the MOS capacitor.

The MOS capacitor shown in FIG. 6A/6B has a structure in which an SiO$_2$ or other insulator is sandwiched between a first terminal X formed from a metal, polysilicon, or other conductor, and a second terminal Y formed from a semiconductor (the N-type semiconductor N-Well in FIG. 7). The space between the X terminal and the Y terminal functions as a capacitor element.

The C-V characteristics of the MOS capacitor (N-Well capacitor) shown in FIG. 6A/6B are as shown in FIG. 7. These characteristics vary according to the voltage Vtune applied between the X terminal and the Y terminal, and it is possible to apply a voltage as the Vtune up to the absolute value of the difference between the GND potential and the power supply voltage VDD (FIG. 7, applied voltage range 401). In the case of the usual CMOS process, the range (variance region) 402 in which the capacitance value varies in proportion to the Vtune is as narrow as 1 V, the linear region 403 in which the capacity can be considered to vary linearly in proportion to the Vtune becomes more narrow, and only about 0.5V is often obtained. Specifically, the variable capacitor elements 616 and 617 provided to the VCO 604 in the present embodiment are elements having characteristics such that the linear region 403 is narrow with respect to the applied voltage range 401.

The interconnection between component elements in the VCO 604 will be described herein.

The terminals on the semiconductor sides (the second terminals Y) of the variable capacitor element 616 and the variable capacitor element 617 are connected with each other, and this connection point is connected to the terminal 610.

The terminal on the conductor electrode side (the first terminal X) of the variable capacitor element 616 is connected to one end of the inductor 615, and the terminal on the conductor electrode side of the variable capacitor element 617 is connected to the other end of the inductor 615. The point at which the terminal on the conductor side of the variable capacitor element 616 is connected to the inductor 615 is designated as point P1, and the point at which the terminal on the conductor side of the variable capacitor element 617 is connected to the inductor 615 is designated as point P2.

The source terminal of the PMOS transistor 611 is connected to the power supply potential (VDD); the drain terminal thereof is connected to the source terminal of the NMOS transistor 612; the gate terminal thereof is connected to the gate terminal of the NMOS transistor 612; and the drain terminal of the NMOS transistor 612 is grounded.

In the same manner, the source terminal of the PMOS transistor 613 is connected to the power supply potential (VDD); the drain terminal thereof is connected to the source terminal of the NMOS transistor 614; the gate terminal thereof is connected to the gate terminal of the NMOS transistor 614; and the drain terminal of the NMOS transistor 614 is grounded.

The gate terminals of the PMOS transistor 611 and NMOS transistor 612 are connected to the connection point between the drain terminal of the PMOS transistor 613 and the source terminal of the NMOS transistor 614. In the same manner, the gate terminals of the PMOS transistor 613 and NMOS transistor 614 are connected to the connection point between the drain terminal of the PMOS transistor 611 and the source terminal of the NMOS transistor 612.

Furthermore, the connection point between the drain terminal of the PMOS transistor 611 and the source terminal of the NMOS transistor 612 is connected to point P1, and the connection point between the drain terminal of the PMOS transistor 613 and the source terminal of the NMOS transistor 614 is connected to point P2.

One end of the capacitor 618 is connected to point P1, and the other end thereof is connected to the switch 624. In the same manner, one end of the capacitor 619 is connected to point P1, the other end thereof is connected to the switch 625, one end of the capacitor 620 is connected to point P1, and the other end thereof is connected to the switch 626.

One end of the capacitor 621 is connected to point P2, and the other end thereof is connected to the switch 627. In the same manner, one end of the capacitor 622 is connected to point P2, the other end thereof is connected to the switch 628, one end of the capacitor 623 is connected to point P2, and the other end thereof is connected to the switch 629.

Furthermore, the switches 624 through 629 switch between states whereby the corresponding capacitor (any one corresponding capacitor among capacitors 618 through 623) is connected or unconnected, by opening and closing under the control of the VCO automatic tuning circuit 607.

The variable divider circuit 605 fulfills the role of performing feedback to the phase frequency comparison circuit 601 of the signal SIG in which the output signal fvco of the VCO 604 is N-divided. The division number N of the variable divider circuit 605 is presented from the division number control circuit 606 based on data input from the outside.

Figure 2:
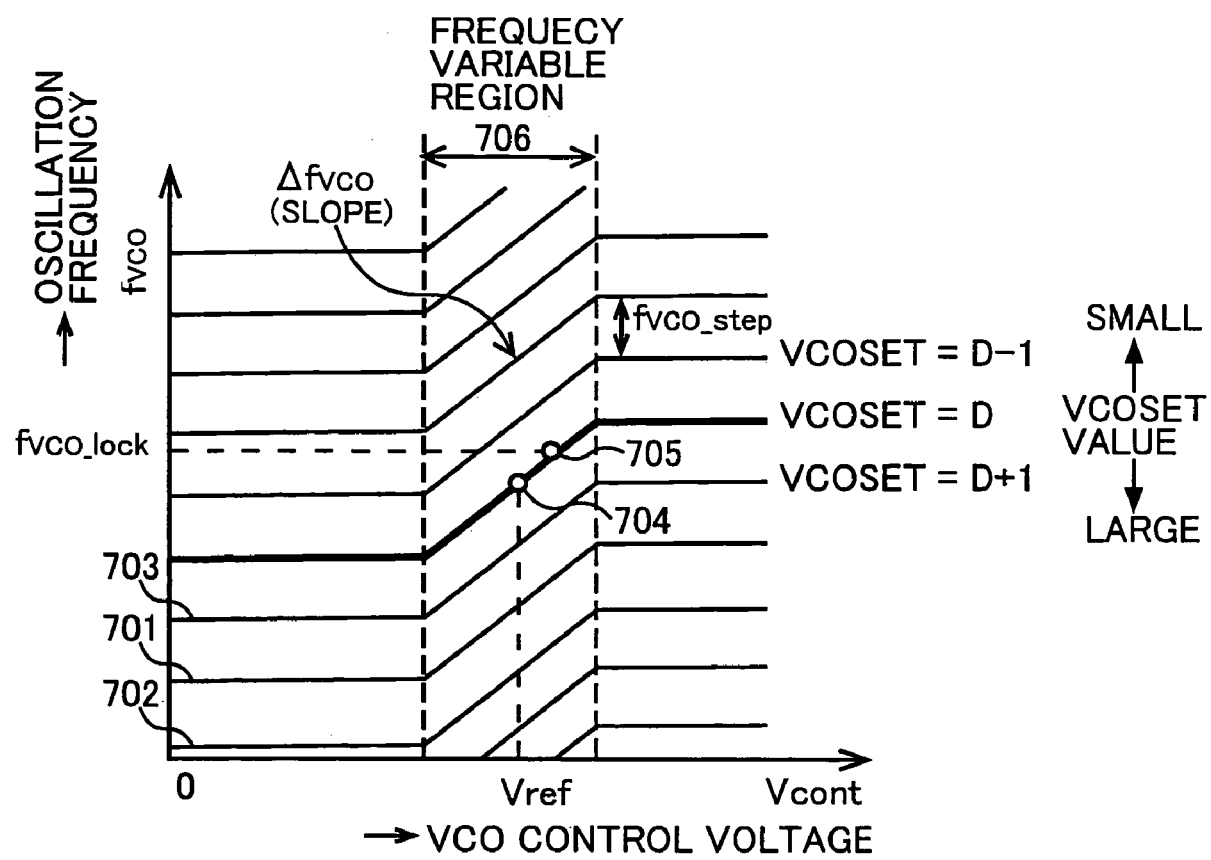
FIG. 2 is a diagram (in an ideal state) illustrating VCO automatic frequency tuning in the PLL frequency synthesizer circuit of FIG. 1.

FIG. 2 herein is a diagram (a diagram showing the fvco-Vcont characteristic curve) showing the relationship between the control potential (control voltage) Vcont (x-axis) of the VCO 604 in FIG. 1 and the oscillation frequency fvco (y-axis) of the VCO 604.

As shown in FIG. 2, the fvco-Vcont characteristic curve varies according to how the switches 624 through 629 are controlled to open and close according to the capacitor switching signal VCOSET 636 (FIG. 1) of the nbit for switching the capacitors 618 through 623, and the characteristics of the oscillation frequency of the VCO 604 shift discretely up and down in inverse proportion to the sum of grounded (GND) capacitors among capacitors 618 through 620 and capacitors 621 through 623. In other words, a configuration is adopted whereby the capacitance value used to generate the resonance frequency with the inductor 615 is adjusted by selecting switches 624 through 629 that are in a closed state.

If the fvco-Vcont characteristics indicated by the curve 701 exist when the value of VCOSET is a certain value, then the sum of capacities increases if the value of the signal VCOSET 636 is increased by one, and the oscillation frequency characteristics decrease from the characteristics indicated by the curve 701 to the characteristics indicated by the curve 702.

The sum of capacities also decreases if the value of the signal VCOSET 636 is reduced by one, and the oscillation frequency characteristics increase from the characteristics indicated by the curve 701 to the characteristics indicated by the curve 703.

The operation of the VCO automatic tuning circuit 607 will be described hereinafter with reference to FIGS. 2 and 3.

The VCO automatic tuning circuit 607 begins the tuning operation with the "Enable" signal generated upon updating of the frequency setting data as a trigger signal, and performs opening and closing control for the switches 624 through 626 and 627 through 629 for switching the capacitors 618 through 620 and 621 through 623 of the VCO 604 so that the VCO 604 can oscillate at the desired frequency fcvo_lock for which locking is desired.

When the "Enable" signal is input to the VCO automatic tuning circuit 607, control is first performed for reversing the state of the two switches of the reference voltage generating circuit 608; specifically, for opening the switch 633 and closing the switch 632.

Whereupon, since the electrical potential Vref is applied to the capacitors 6341 and 6342 of the LPF circuit 603, and the electrical potential Vref is fed to the frequency control terminal 610 of the VCO 604, the VCO 604 oscillates at a frequency that corresponds to the electrical potential Vref.

When the "Enable" signal is input to the VCO automatic tuning circuit 607, control is performed for switching the division number of the variable divider circuit 605, which had hitherto been "N," to "S," the output signal SIG (fvco/S) of the variable divider circuit 605 is counted according to the reference gate time generated from the reference frequency REF, it is determined whether the output signal fvco of the VCO 604 is high or low with respect to the frequency fvco_lock for which locking is desired, and the operation for adjusting the value of the capacitor switching signal VCOSET 636 of the VCO 604 is repeated using the results of this determination.

At this time, if the division number S is a value smaller than N, then the number of SIG signals than can be counted during the reference gate time period increases, and the oscillation frequency of the VCO 604 can be determined with higher accuracy. If the accuracy of the determination is the same, then it is possible to shorten the reference gate time, and to shorten the time required for automatic tuning.

By repeating adjustment of the signal VCOSET 636 as described above, ultimately, the point 704 (FIG. 2) at which the output signal fvco is closest to fvco_lock is retrieved, and with the value of the signal VCOSET 636 fixed to "D" at this time, the states of the switches 632 and 633 of the reference voltage generating circuit 608 are reversed to the steady state (returned to the state in which the switch 633 is closed, and the switch 632 is open), while the division number of the variable divider circuit 605 is returned to N divisions from S divisions.

As a result, the PLL frequency synthesizer circuit returns to the normal operating state, the operation is therefore performed whereby the system is locked to the Nth multiple frequency of the reference frequency (frequency acquisition operation), and the frequency converges after a certain period of time to the point 705 shown in FIG. 2.

By a first embodiment such as described above, the reference voltage generating circuit 608 is provided for applying a reference potential to the variable capacitor elements 616 and 617 of the VCO 604 during the tuning operation performed by the VCO automatic tuning circuit 607, it therefore becomes possible to cause the aforementioned oscillation frequency to approach the desired locking frequency by the tuning operation more reliably than by the conventional method.

Second Embodiment

The drawbacks of the first embodiment will be explained before the PLL frequency synthesizer circuit (FIG. 4) according to a second embodiment is described as a modification of the PLL frequency synthesizer circuit according to the first embodiment described above.

Figure 6B:
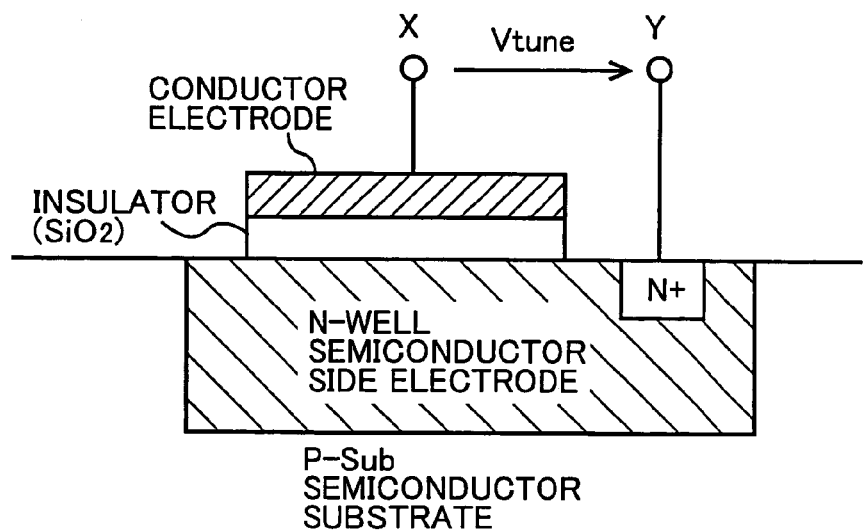

The C-V characteristics of the MOS capacitor (N-Well capacitor) shown in FIG. 6 are as shown in FIG. 7. These characteristics vary according to the voltage Vtune applied between the X terminal and the Y terminal, and it is possible to apply a voltage as the Vtune up to the absolute value of the difference between the GND potential and the power supply voltage VDD (FIG. 7, applied voltage range 401). In the case of the usual CMOS process, the range (variance region) 402 in which the capacitance value varies in proportion to the Vtune is as narrow as 1 V, the linear region 403 in which the capacity can be considered to vary linearly in proportion to the Vtune becomes more narrow, and only about 0.5 V is often obtained. Specifically, the variable capacitor elements 616 and 617 are elements having characteristics such that the linear region 403 is narrow with respect to the applied voltage range 401.

Furthermore, the C-V characteristics of the MOS capacitor shown in FIG. 7 are affected by element variation at the time of semiconductor manufacturing (hereinafter referred to simply as "manufacturing variation") and temperature during operation, the range of the Vtune in which a linear region in the C-V characteristics is obtained shifts to the left and right, and the slope of the characteristics of the linear region also varies. In the VCO 604 of FIG. 1 that uses this MOS capacitor in frequency control, the voltage Vtune at both ends of the MOS capacitor is determined according to the difference in potential between the electrical potential of the control terminal 610 of the VCO 604 and the point P1 (FIG. 1), or according to the difference in potential between the electrical potential of the control terminal 610 and the point P2 (FIG. 1).

In this arrangement, the bias potential of P1 fluctuates according to the balance of the threshold values (hereinafter referred to as Vt) of the PMOS transistor 611 and the NMOS transistor 612, the power supply voltage VDD, and the temperature Tj. In the same manner, the bias potential of P2 fluctuates according to the Vt balance of the PMOS transistor 613 and the NMOS transistor 614, the power supply voltage VDD, and the temperature Tj.

Therefore, in the frequency variable region 706 of the Vcont-fvco characteristics shown in FIG. 2, the range in which the frequency varies linearly according to the characteristics of the MOS capacitor is as narrow as 0.5 V; furthermore, the frequency variable range shifts to the left and right according to manufacturing variation, power supply voltage VDD, and temperature Tj, and even the slope of the frequency variable range varies. Therefore, it is extremely difficult to implement a circuit in which the reference voltage Vref applied during automatic tuning of the VCO 604 of FIG. 1 is always within the range of the frequency variable region 706 in spite of the manufacturing variation, the power supply voltage VDD, the temperature Tj, and other conditions.

The drawbacks described above will be described in further detail hereinafter.

Figure 3:
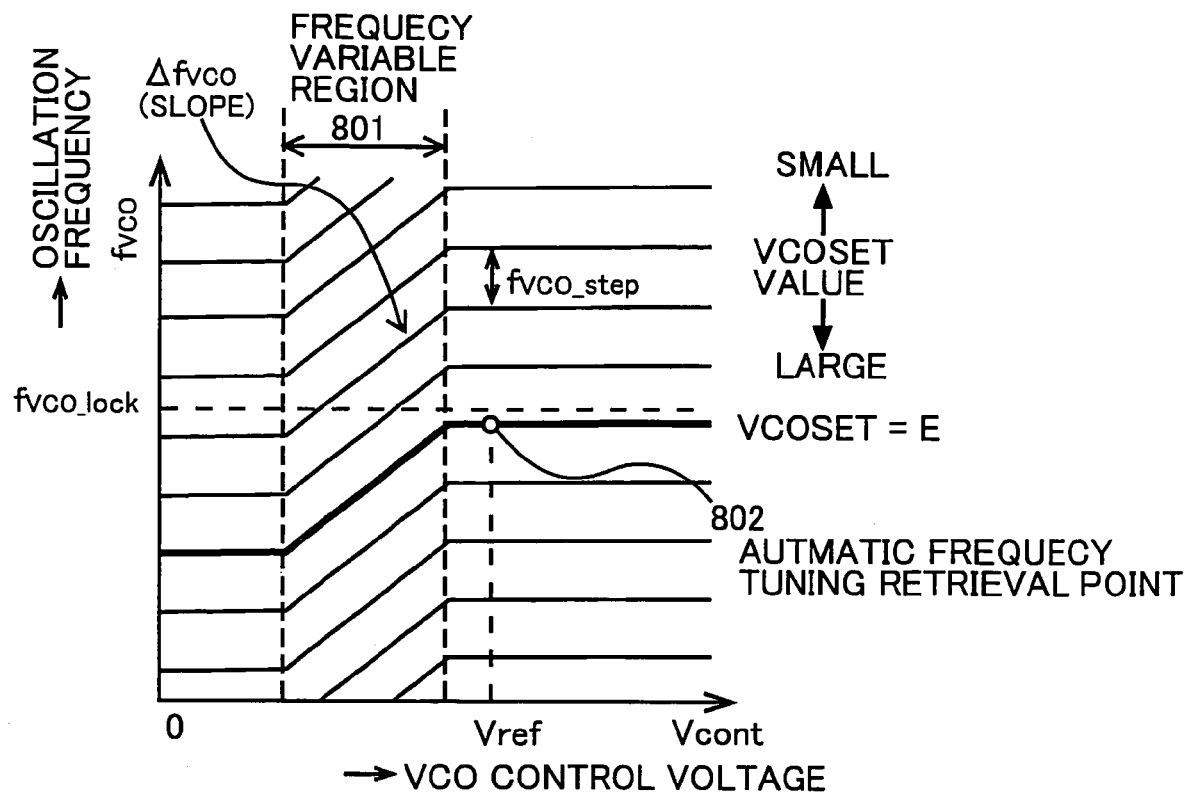
FIG. 3 is a diagram illustrating VCO automatic frequency tuning in the PLL frequency synthesizer circuit of FIG. 1 (when affected by element variance or temperature, and power supply voltage)

FIG. 3 is a diagram illustrating the fvco-Vcont characteristics in the PLL frequency synthesizer circuit shown in FIG. 1 when the frequency variable region 801 of the VCO 604 is shifted to the left by the effects of manufacturing variation, temperature Tj, fluctuations in the power supply voltage VDD, and other conditions.

In FIG. 3, since the frequency variable region 801 is shifted to the left, the voltage Vref applied to the control terminal 610 by the reference voltage generating circuit 608 during VCO automatic tuning is outside the range of the VCO frequency variable region 801.

In this case, the point 802 is retrieved in the automatic frequency tuning, an "E" is set as the value of the capacitor switching signal VCOSET 636 of the VCO 604, and the PLL frequency synthesizer circuit then makes the transition to the locking operation.

However, in this state, since the VCO oscillation frequency fvco can only vary on the characteristic curve in which the point 802 exists regardless of what electrical potential is given to the Vcont, the PLL frequency synthesizer circuit cannot cause the frequency to converge on the desired frequency fvco_lock.

A configuration may be adopted whereby the voltage Vref has characteristics such that the value thereof varies in conformity with the variation of the frequency variable region 801 in order for the PLL frequency synthesizer to be able to retrieve the locked frequency in automatic frequency tuning, but since the characteristics of the variable capacitor elements (MOS capacitors) 616 and 617 vary according to manufacturing variation and the temperature Tj, and the bias of the P1 and P2 of the CMOS VCO 604 varies according to manufacturing variation, the power supply voltage VDD, and the temperature Tj, it is extremely difficult to obtain a circuit in which the voltage Vref varies in conjunction with the variation of both these biases.

Therefore, when all of the circuits of the PLL frequency synthesizer shown in FIG. 1 are integrated on a semiconductor integrated circuit, the need arises to perform control so that the voltage Vref exists within the variation range of the frequency variable region 801 of the VCO 604 by suppressing fluctuation in the characteristics of CMOS transistors and variable capacitor elements in the semiconductor manufacturing stage, to perform trimming in advance for adjusting the element values thereof in accordance with usage conditions, or to perform other operations. As a result, the manufacturing yield decreases, more time is required in the inspection process after manufacturing, and other drawbacks arise.

A second embodiment in which the drawbacks of the first embodiment are overcome will next be described.

Figure 4:
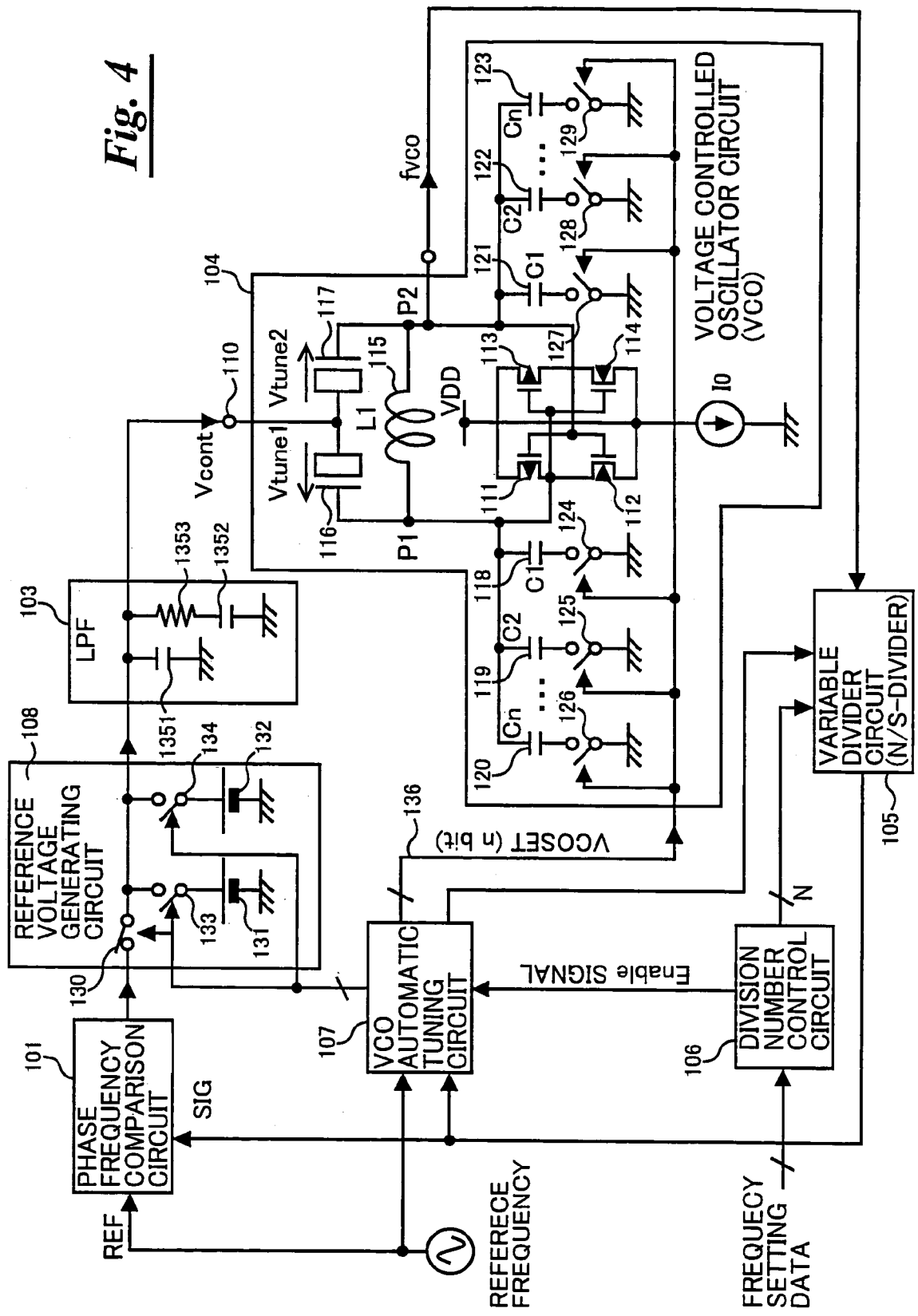
FIG. 4 is a circuit diagram showing the PLL frequency synthesizer circuit according to a second embodiment of the present invention.

The PLL frequency synthesizer circuit according to the second embodiment shown in FIG. 4 is composed of a negative feedback loop made up of the phase frequency comparison circuit 101, the LPF circuit 103, the VCO circuit 104, the variable divider circuit 105, the division number control circuit 106, the VCO automatic tuning circuit 107, and the reference voltage generating circuit 108, and these components are integrated on a semiconductor integrated circuit (not shown).

Among these components, since the structure of circuits other than the VCO automatic tuning circuit 107, the reference voltage generating circuit 108, and the VCO 104 is the same as in the PLL frequency synthesizer circuit (FIG. 1) according to the abovementioned first embodiment, detailed description thereof is omitted.

Specifically, the phase frequency comparison circuit 101 is the same as the phase frequency comparison circuit 601 of FIG. 1, the variable divider circuit 105 is the same as the variable divider circuit 605 of FIG. 1, and the division number control circuit 106 is the same as the division number control circuit 606 of FIG. 1.

The LPF circuit 103 is provided with capacitors 1351 and 1352, and with a resistor 1353. The capacitors 1351 and 1352 and the resistor 1353 are the same as the capacitors 6341 and 6342 and the resistor 635 in the LPF circuit 603, respectively.

Detailed descriptions will next be given of the VCO automatic tuning circuit 107, the reference voltage generating circuit 108, and the VCO 104.

First, the reference voltage generating circuit 108 is provided with switches 130, 133, and 134, and two voltage sources (reference voltage sources) with mutually different low-potential Vref_L 131 and high-potential Vref_H 132.

Among these components, the switch 130 switches between a state of connection between the output of the phase frequency comparison circuit 101 and the LPF circuit 103 (and the VCO 104 ahead of it), and a state of disconnection between these components under the control of the VCO automatic tuning circuit 107.

The switch 133 switches between a state of connection between the low-potential Vref_L 131 and the LPF circuit 103 (and the VCO 104 ahead of it), and a state of disconnection between these components under the control of the VCO automatic tuning circuit 107. In the same manner, the switch 134 switches between a state of connection between the high-potential Vref_H 132 and the LPF circuit 103 (and the VCO 104 ahead of it), and a state of disconnection between these components.

In a steady state, a condition is established in which the switch 130 is closed and the switches 133 and 134 are open, the output voltage or output current of the phase frequency comparison circuit 101 is fed to the LPF circuit 103, and an electrical potential in which the alternating current component is removed from the output of the phase frequency comparison circuit 101 is fed to the terminal 110 of the VCO 104.

The electrical potential of the Vref_L 131 is set to a potential such that when the Vref_L 131 is applied to the control terminal 110 of the VCO 104, the values (capacitance values) of the MOS capacitor variable capacitor elements 116 and 117 are sufficiently saturated, and the capacitance values of these variable capacitor elements 116 and 117 are maximized.

On the other hand, when the Vref_H is applied to the control terminal 110 of the VCO 104, the electrical potential of the high-potential Vref_H 132 is set to a potential such that the values of the MOS capacitor variable capacitor elements 116 and 117 are sufficiently saturated, and the capacitance values thereof are minimized.

In this arrangement, it is even more preferred that each of the two types of electrical potentials that include the electrical potentials of the Vref_L 131 and the Vref_H 132 be set to values such that the C-V characteristics of the variable capacitor elements 116 and 117 are saturated even if the C-V characteristics fluctuate due to manufacturing variation.

The basic structure of the VCO 104 is the same as that of the VCO 604 in the abovementioned first embodiment.

Specifically, as shown in FIG. 4, the VCO 104 is provided with variable capacitor elements 116 and 117; an inductor 115; PMOS transistors 111 and 113; NMOS transistors 112 and 114; capacitors 118, 119, 120, 121, 122, and 123; and switches 124, 125, 126, 127, 128, and 129. The variable capacitor elements 116 and 117, inductor 115, PMOS transistors 111 and 113, NMOS transistors 112 and 114, capacitors 118 through 123, and switches 124 through 129 are the same as the variable capacitor elements 616 and 617, inductor 615, PMOS transistors 611 and 613, NMOS transistors 612 and 614, capacitors 618 through 623, and switches 624 through 629, respectively, in the VCO 604.

The VCO 104 is an LC-type oscillator circuit that uses a reverse inverter circuit made up of a combination of PMOS transistors and NMOS transistors in a negative resistance circuit, the same as the VCO 604, and the components that correspond to the reverse inverter circuit are the combination of the PMOS transistor 111 and the NMOS transistor 112, and the combination of the PMOS transistor 113 and the NMOS transistor 114. In the VCO 104, the LC resonance circuit for varying the oscillation frequency is made up of n (6, for example) capacitor arrays composed of an inverter 115, variable capacitor elements 116 and 117, capacitors 118 through 123 having weighted capacitance values, and switches 124 through 129.

Figure 8:
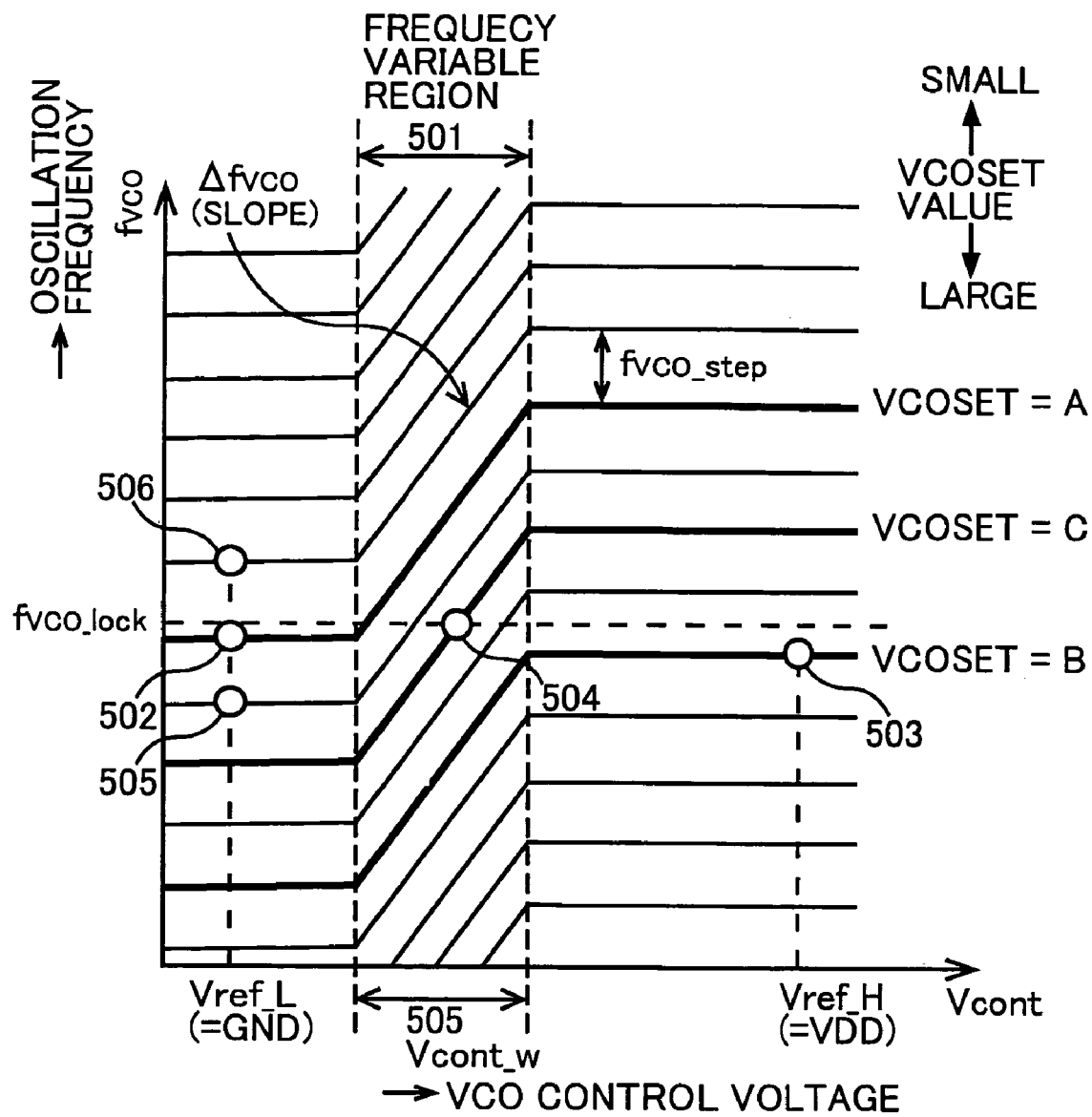
FIG. 8 is a diagram illustrating VCO automatic frequency tuning in the PLL frequency synthesizer circuit of FIGS. 4 and 5.
Figure 9:
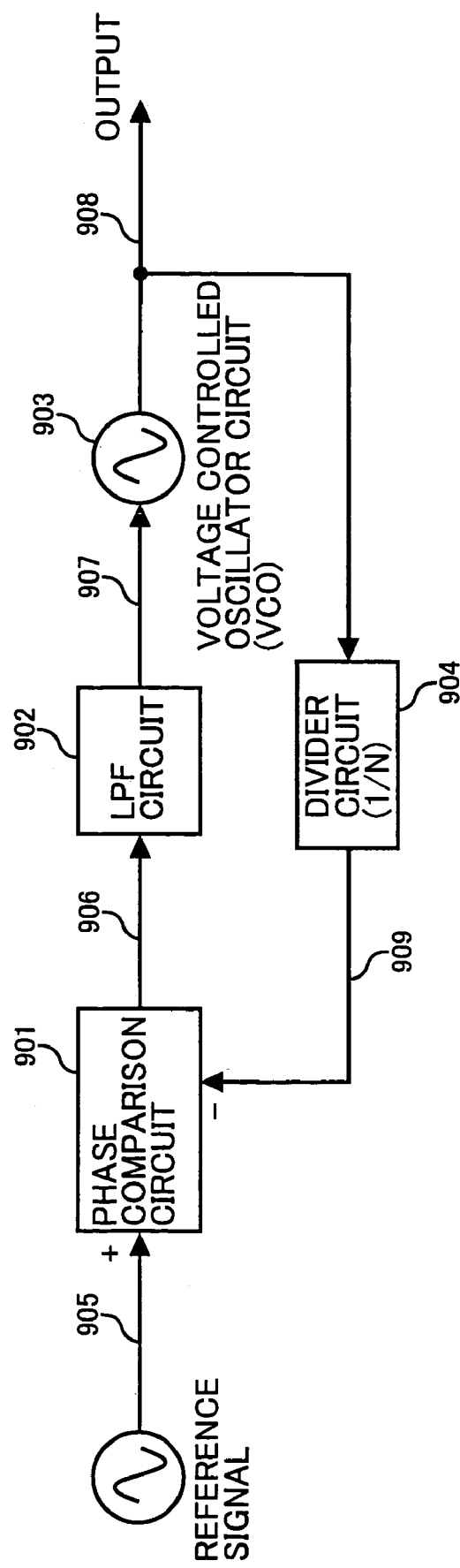
FIG. 9 is a block diagram showing the structure of a common PLL frequency synthesizer circuit.
Figure 10:
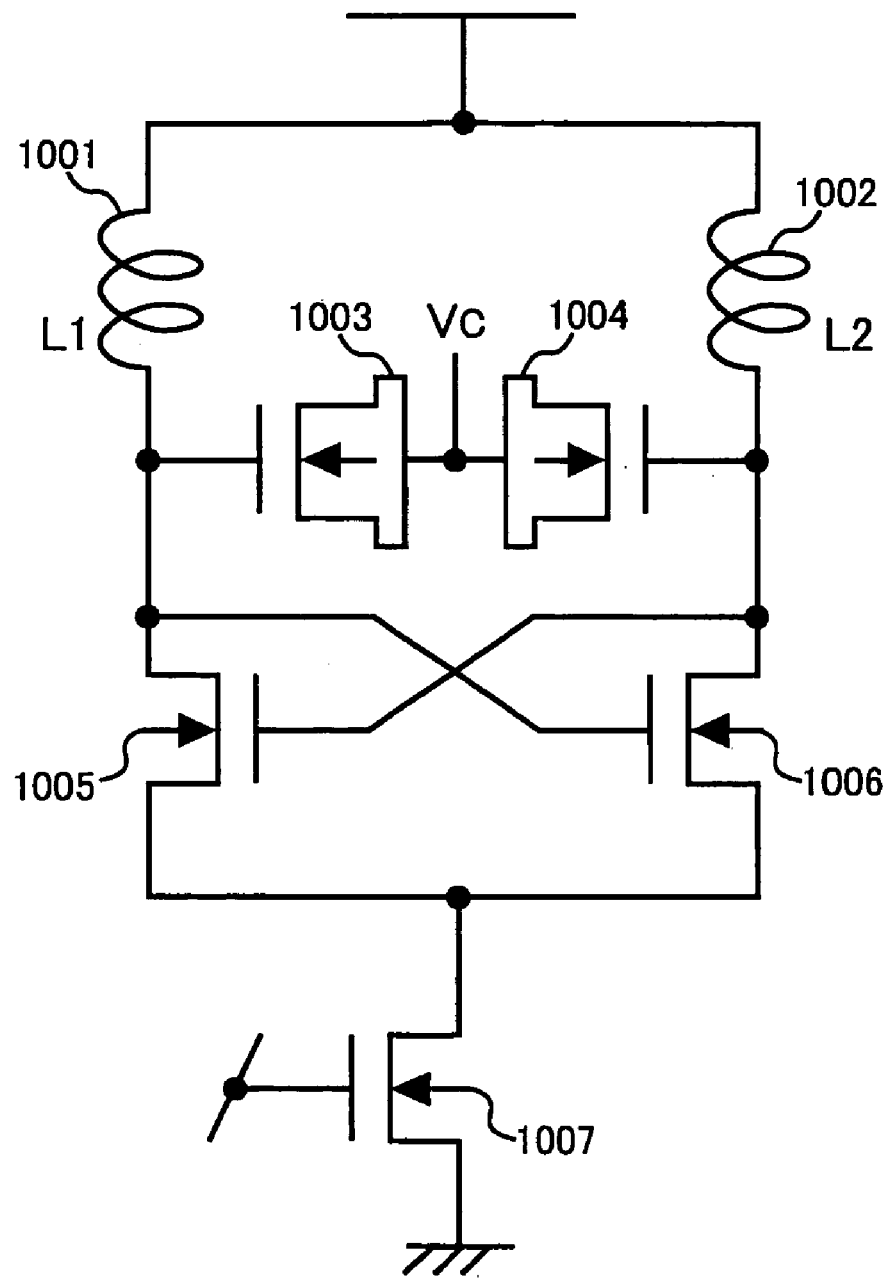
FIG. 10 is a circuit diagram showing the conventional voltage controlled oscillator circuit (VCO)
Figure 11:
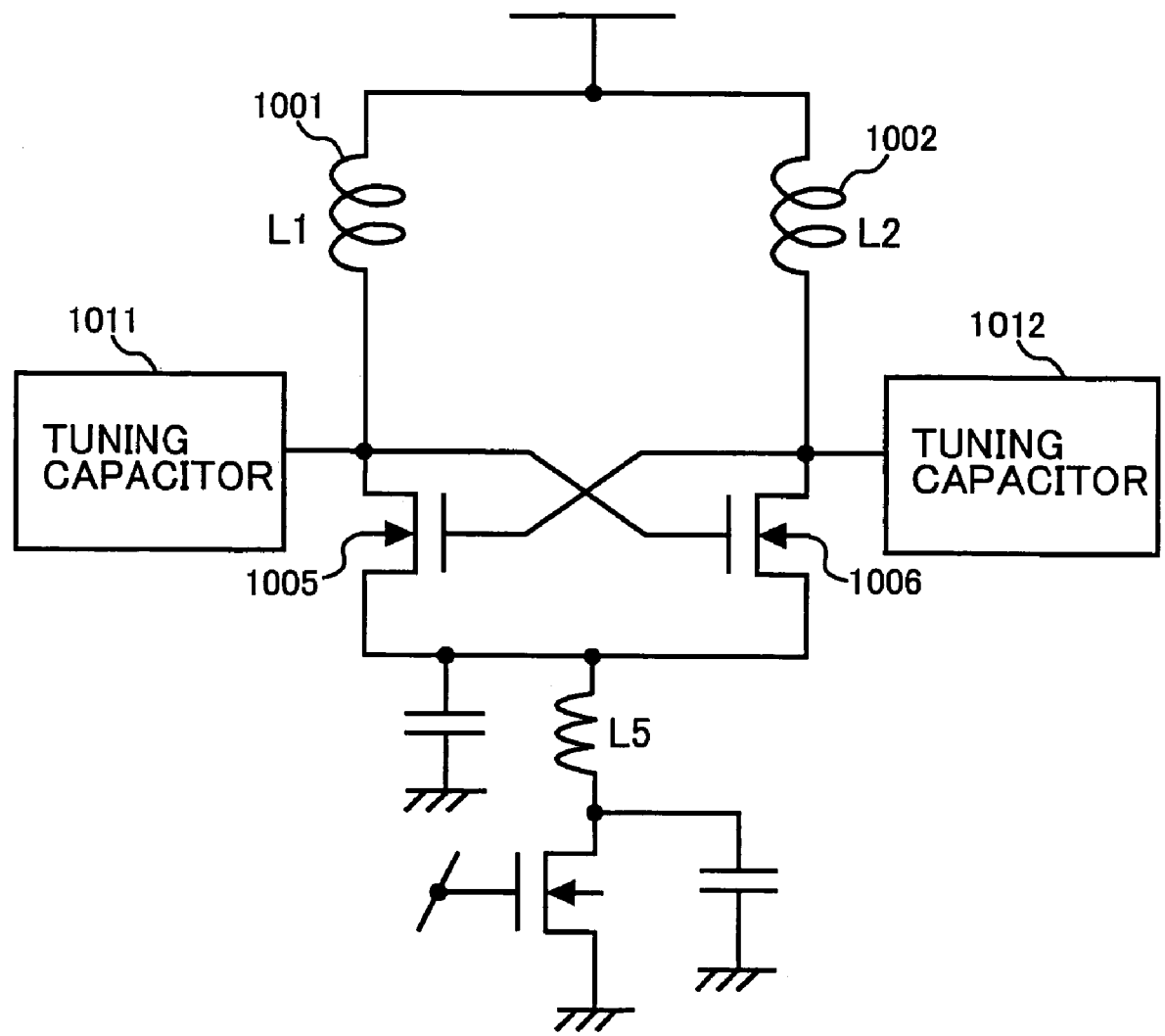
FIG. 11 is a circuit diagram showing the conventional voltage controlled oscillator circuit (VCO)
Figure 12:
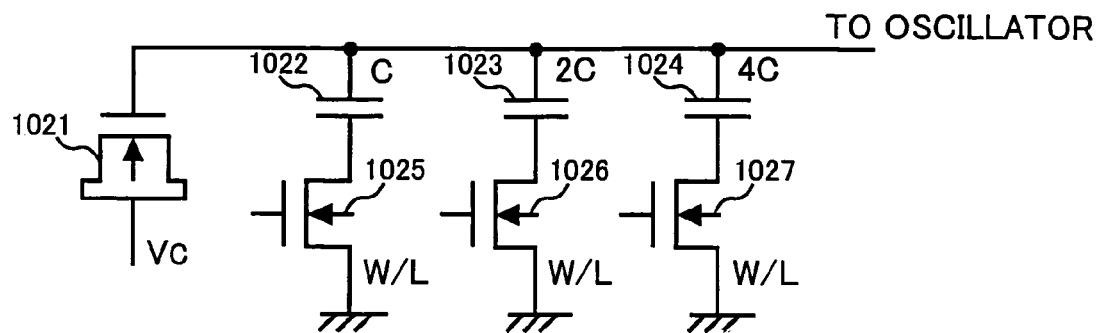
FIG. 12 is a circuit diagram showing the conventional voltage controlled oscillator circuit (VCO)
Figure 13:
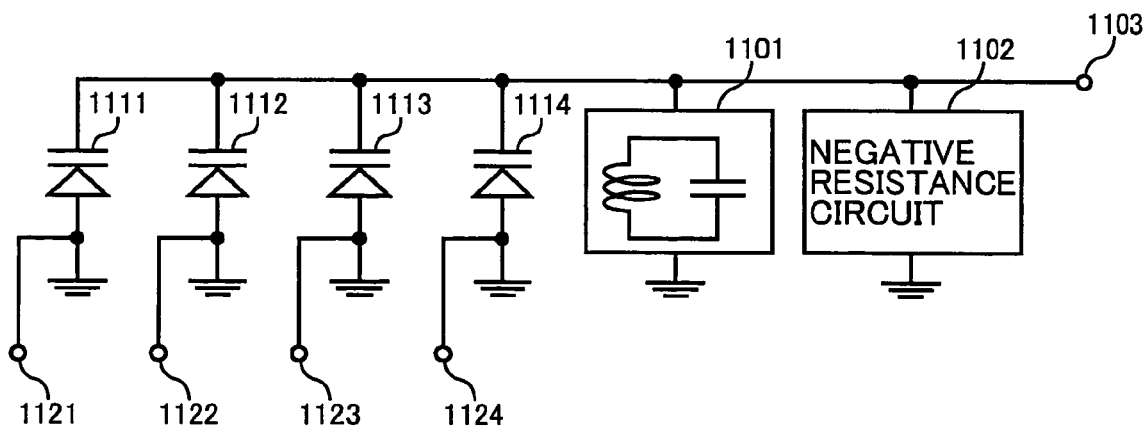
FIG. 13 is a circuit diagram showing the conventional voltage controlled oscillator circuit (VCO).

However, the VCO 104 of the present embodiment must be designed so that the frequency variation amount fvco_step of the switching step of the oscillation frequency has characteristics that are sufficiently smaller than the value of the product of the frequency variable range Δfvco due to voltage control and the width Vcont_w in which the fvco is proportional to the Vcont, so that malfunction does not occur in the automatic tuning mechanism for the VCO oscillation frequency (see FIG. 8).

In order to prevent malfunctioning of the automatic tuning mechanism for the VCO oscillation frequency, the weightings of the capacitance values of capacitors 118 through 120 and 121 through 123 are preferably adjusted in advance so that the following condition is satisfied in an ideal state:

fvco_step≦Δfvco/4.

The VCO automatic tuning operation of the PLL frequency synthesizer shown in FIG. 4 will next be described with reference to the fvco-Vcont characteristics illustrated in FIG. 8.

The VCO automatic tuning circuit 107 begins the operation with the "Enable" signal generated upon updating of the frequency setting data as a trigger signal, and executes automatic tuning twice (by the first tuning operation and the second tuning operation) according to the method described below.

First, in the first automatic tuning (first tuning operation, first tuning step), the "Enable" signal is input, whereupon control is performed for opening the switch 130 of the reference voltage generating circuit 108, closing the switch 133 thereof, and switching the division number of the variable divider circuit 105 from the usual "N" to "S."

The electrical potential of the low-potential Vref_L 131 is then applied to the LPF circuit 103 by the closing of the switch 133, the low-potential Vref_L 131 is fed to the frequency control terminal 110 of the VCO 104, and the VCO 104 oscillates at a frequency that corresponds to the low-potential Vref_L 131.

In this state, the VCO automatic tuning circuit 107 counts the output signal SIG (fvco/S) of the variable divider circuit 105 according to the reference gate time generated from the reference frequency REF, and determines whether the fvco is high or low with respect to the frequency fvco_lock (locking frequency) for which locking is desired. The operation for adjusting the value of the capacitor switching signal VCOSET 136 of the VCO 104 is repeated using the results of this determination.

Ultimately, the point 502 (FIG. 8: first setting value) at which the fvco most closely approaches the fvco_lock is retrieved, the value "A" is stored for the VCOSET 136 at this time, and the first automatic frequency tuning is completed.

In the second automatic tuning (second tuning operation, second tuning step) the VCO automatic tuning circuit 107 performs control for opening the switch 133 of the reference voltage generating circuit 108 and closing the switch 134 thereof.

In this case, the electrical potential of the high-potential Vref_H 132 is then applied to the LPF circuit 103, the high-potential Vref_H 132 is fed to the frequency control terminal 110 of the VCO 104, and the VCO 104 oscillates at a frequency that corresponds to the high-potential Vref_H 132.

In this state, the VCO automatic tuning circuit 107 counts the output signal SIG (fvco/S) of the variable divider circuit 105 according to the reference gate time generated from the reference frequency REF, and determines whether the fvco is high or low with respect to the frequency fvco_lock for which locking is desired. The operation for adjusting the value of the capacitor switching signal VCOSET 136 of the VCO 104 is repeated using the results of this determination.

Ultimately, the point 503 (FIG. 8: second setting value) at which the fvco most closely approaches the fvco_lock is retrieved, the value "B" is stored for the VCOSET 136 at this time, and the second automatic frequency tuning is completed.

When the second tuning step is started, retrieval is preferably started using the value "A" for the VCOSET found in the first tuning step as the starting point, because the time required for the second retrieval step can thus be shortened.

The VCO automatic tuning circuit 107 then fixes the value of the capacitor switching signal VCOSET 136 of the VCO 104 to "C," which is the value at the midpoint between "A" found in the first automatic frequency tuning and "B" found in the second automatic frequency tuning (third tuning operation, third tuning step), and returns the division number of the variable divider circuit 105 to N divisions from S divisions.

The VCO automatic tuning circuit 107 also opens the switch 134 of the reference voltage generating circuit 208 while closing the switch 130 thereof, and returns the PLL loop to the steady state.

As a result, the PLL frequency synthesizer circuit performs the operation for locking the system to the $N^{th}$ multiple frequency of the reference frequency, and the frequency converges at the point 504 shown in FIG. 8 after a certain period of time.

In this arrangement, in order to ensure that the value C between values A and B of the VCOSET 136 found by the automatic tuning always exists, the relationship in equation (3) below must be satisfied in an ideal state. In this equation, the modulation sensitivity of the VCO 104 is Δfvco, the width of the Vcont region in which the fvco varies in proportion to the Vcont is Vcont_w, and the amount of frequency variance when the value of the VCOSET 136 is varied by one is fvco_step.

$$(\Delta fvco \times Vcont\_w)/4 \geq fvco\_step \quad \text{Equation (3)}$$

In this arrangement, since the output SIG of the variable divider circuit 105 is counted by the gate time created based on the reference signal, and the height of the VCO oscillation frequency is determined, miscounting to the extent of about ±1 is predicted due to the timing relationship between the SIG signal and the gate time, or to disturbance during automatic tuning. Therefore, a margin must be allowed for in the actual design.

In the above description, an example was described in which the first automatic tuning is performed using the electrical potential of the low-potential Vref_L 131, and the second automatic tuning is performed using the electrical potential of the high-potential Vref_H 132, but the same effects are obtained if the first automatic tuning is performed using the high-potential Vref_H 132, and the second automatic tuning is performed using the low-potential Vref_L 131.

By a second embodiment such as the one described above, the effects described hereinafter can be obtained.

In the case of the PLL frequency synthesizer circuit according to the first embodiment shown in FIG. 1, in order for the PLL frequency synthesizer circuit to lock, the PLL frequency synthesizer circuit cannot tune the VCO 604 to the frequency at which locking is desired if the voltage Vref applied to the control terminal 610 of the VCO 604 during automatic frequency tuning is not continually kept in the region in which the frequency of the VCO 604 varies in proportion to the applied voltage.

In contrast, in the case of the second embodiment, the reference voltage Vref applied during automatic tuning of the oscillation frequency of the VCO 204 is configured such that automatic frequency tuning is performed under the two conditions that include the low-potential Vref_L 131 and the high-potential Vref_H 132 at which the C-V characteristics of the variable capacitor elements (MOS capacitors) 216 and 217 are sufficiently saturated.

Therefore, even if the characteristics of the MOS capacitors or CMOS transistors fluctuate due to variations in semiconductor characteristics, temperature, or power supply voltage, and the fvco-Vcont characteristics shown in FIG. 8 fluctuate vertically and horizontally, the VCO 104 can oscillate at the frequency at which locking of the PLL frequency synthesizer circuit is desired if the value thereof is the VCOSET value between the value one step smaller than the capacitor switching set VCOSET value "A" retrieved by performing automatic frequency tuning at the Vref_L 131, and the value one step larger than the capacitor switching set value "B" found by performing automatic frequency tuning at the Vref_H 132. This fact is apparent from the fvco-Vcont characteristics shown in FIG. 8.

Therefore, by shifting to the locking operation for the PLL frequency synthesizer circuit after the capacitor switching set value VCOSET is set to "C," which is a value between "A" and "B," the PLL frequency synthesizer circuit can be caused to reliably lock onto the desired frequency.

In short, by the second embodiment, even when the threshold values (Vt) of the CMOS transistors and the C-V characteristics of the variable capacitor elements are shifted due to manufacturing variation, temperature, power supply voltage, and the like, the oscillation frequency of the VCO 104 can be reliably adjusted to the frequency for which locking of the PLL frequency synthesizer circuit is desired.

Since there is no longer a need to suppress variance in the characteristics of the CMOS transistors to an excessive degree in the semiconductor manufacturing stage, a high yield can be obtained even when all of the circuits of the PLL frequency synthesizer are integrated by a common CMOS semiconductor process, and low-cost, large-scale production becomes possible.

Third Embodiment

The PLL frequency synthesizer circuit according to a third embodiment will next be described with reference to FIG. 5.

Figure 5:
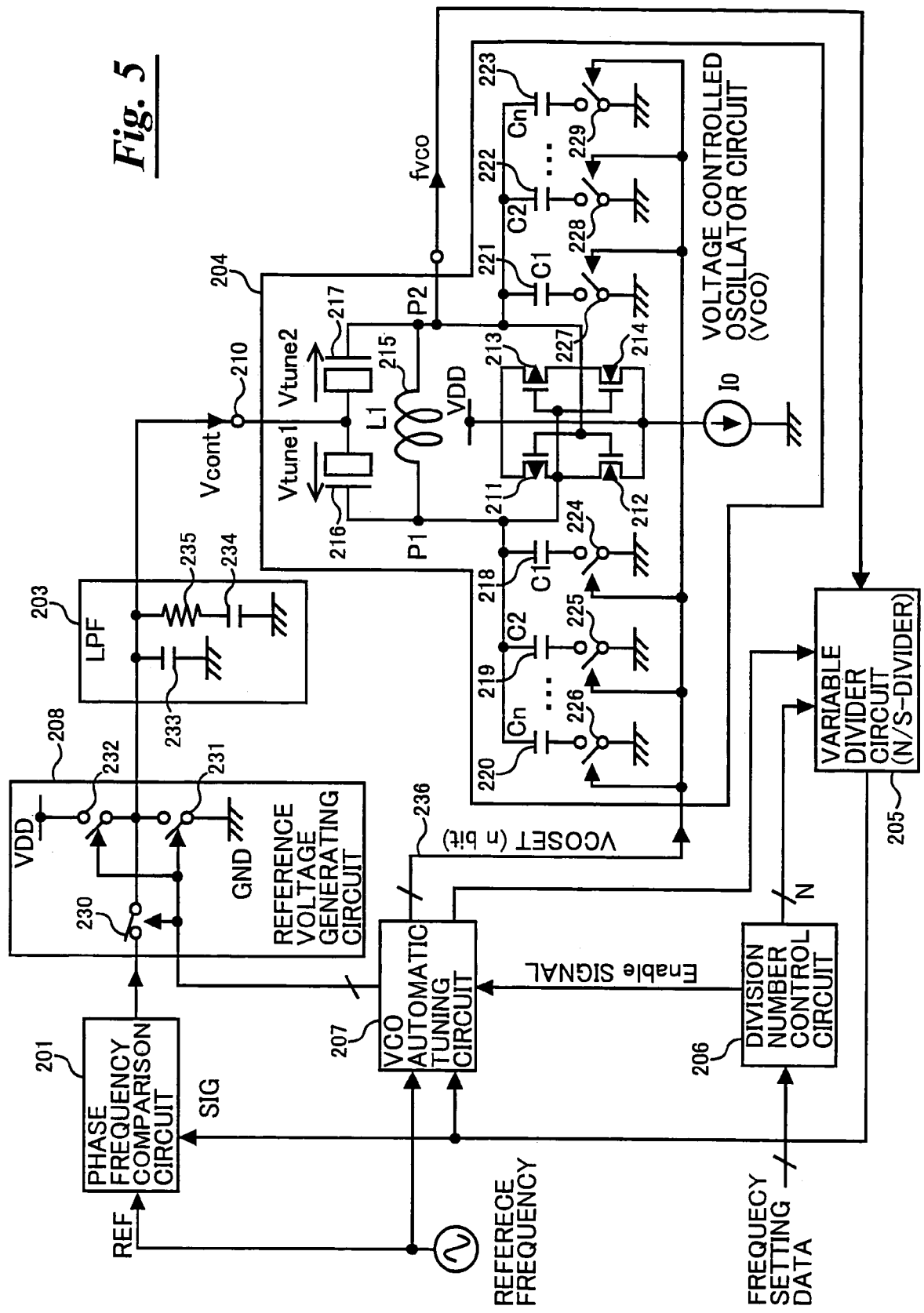
FIG. 5 is a circuit diagram showing the PLL frequency synthesizer circuit according to a third embodiment of the present invention.

The PLL frequency synthesizer circuit according to the third embodiment shown in FIG. 5 is composed of a negative feedback loop made up of the phase frequency comparison circuit 201, the LPF circuit 203, the VCO 204, the variable divider circuit 205, the division number control circuit 206, the VCO automatic tuning circuit 207, and the reference voltage generating circuit 208, and the components are integrated on a semiconductor integrated circuit (not shown).

Among these components, circuits other than the reference voltage generating circuit 208 have the same structure as in the PLL frequency synthesizer circuit (FIG. 4) according to the abovementioned second embodiment, and detailed description thereof is therefore omitted.

Specifically, the phase frequency comparison circuit 201 is the same as the phase frequency comparison circuit 101 of FIG. 4, the LPF circuit 203 is the same as the LPF circuit 103 of FIG. 4, the VCO 204 is the same as the VCO 104, the variable divider circuit 205 is the same as the variable divider circuit 105 of FIG. 4, the division number control circuit 206 is the same as the division number control circuit 106 of FIG. 4, and the VCO automatic tuning circuit 207 is the same as the VCO automatic tuning circuit 107 of FIG. 4.

The LPF circuit 203 is provided with capacitors 233 and 234, and with a resistor 235, but the capacitors 233 and 234 and the resistor 235 are the same as the capacitors 1351 and 1352 and the resistor 1353 in the LPF circuit 103.

The VCO 204 is provided with variable capacitor elements 216 and 217; an inductor 215; PMOS transistors 211 and 213; NMOS transistors 212 and 214; capacitors 218, 219, 220, 221, 222, and 223; and switches 224, 225, 226, 227, 228, and 229. The variable capacitor elements 216 and 217, inductor 215, PMOS transistors 211 and 213, NMOS transistors 212 and 214, capacitors 218 through 223, and switches 224 through 229 are the same as the variable capacitor elements 116 and 117, inductor 115, PMOS transistors 111 and 113, NMOS transistors 112 and 114, capacitors 118 through 123, and switches 124 through 129, respectively, in the VCO 104.

Specifically, the VCO 204 is an LC-type oscillator circuit that uses a reverse inverter circuit made up of a combination of PMOS transistors and NMOS transistors in a negative resistance circuit, and the components that correspond to the reverse inverter circuit are the combination of the PMOS transistor 211 and the NMOS transistor 212, and the combination of the PMOS transistor 213 and the NMOS transistor 214. In the VCO 204, the LC resonance circuit for varying the oscillation frequency is made up of n (6, for example) capacitor arrays composed of an inverter 215, variable capacitor elements 216 and 217, capacitors 218 through 223 having weighted capacitance values, and switches 224 through 229.

In the abovementioned second embodiment (FIG. 4), the reference voltage generating circuit 108 is configured using the low-potential Vref_L 131 and the high-potential Vref_H 132 as two reference voltage sources, but since the low-potential Vref_L and high-potential Vref_H can be electrical potentials at which the capacitor variance characteristics of the variable capacitor elements (the variable capacitor elements 216 and 217 in the case of FIG. 5) are sufficiently saturated, no problems result from setting the Vref_L to the GND potential and the Vref_H to the power supply voltage VDD, for example.

Therefore, in the case of the present embodiment, the reference voltage generating circuit 208 is provided instead of the reference voltage generating circuit 108 in the second embodiment, as shown in FIG. 5.

Specifically, the reference voltage generating circuit 208 is provided with the switch 230, the switch 231, and the switch 232, and the switch 230 among these components is configured so as to switch between a state of connection between the output of the phase frequency comparison circuit 201 and the LPF circuit 203 (and the VCO 204 ahead of it), and a state of disconnection between these components under the control of the VCO automatic tuning circuit 207. The switch 231 is configured so as to switch between a state of connection between the GND potential as the low-potential Vref_L and the LPF circuit 203 (and the VCO 204 ahead of it), and a state of disconnection between these components. In the same manner, the switch 232 is configured so as to switch between a state of connection between the VDD potential (power supply potential) as the high-potential Vref_H and the LPF circuit 203 (and the VCO 204 ahead of it), and a state of disconnection between these components.

In the case of the present embodiment, since the only modification to the automatic tuning procedure is that the GND potential is substituted for the low-potential Vref_L, and the VDD potential is substituted for the high-potential Vref_H in the second embodiment described above, and other aspects thereof are the same as in the second embodiment, description thereof is omitted.

In a third embodiment such as described above, the reference voltage generating circuit 208 can be obtained with a simple structure composed solely of the switches 230, 231, and 232, and the design thereof is simplified.

Since a reference voltage generating circuit 108 for generating an electrical potential in analog or digital fashion becomes unnecessary, the area occupied by the reference voltage generating circuit 208 on a semiconductor integrated circuit is reduced in size, and lower cost manufacturing becomes possible.

Furthermore, since the electrical potentials supplied from the reference voltage generating circuit 208 can have the two values that include those of the GND potential and the VDD potential, even if there is a wide specification of 2.5 V to 5 V for the power supply voltage (VDD) in the PLL frequency synthesizer circuit, the circuit of the present invention has the advantage of being capable of operating without any adjustment.

It is apparent that the present invention is not limited to the above embodiment and it may be modified and changed without departing from the scope and spirit of the invention.

What is claimed is:

1. A PLL frequency synthesizer circuit integrated on a semiconductor integrated circuit, comprising:
    a voltage-controlled oscillator circuit provided with a capacitor, an inductor, and a variable capacitor element for oscillating using the resonance frequencies of the capacitor and inductor, for outputting the oscillation frequency signal of the variable capacitor element;
    a negative feedback loop circuit configured to comprise the voltage-controlled oscillator circuit, capable of looping the signal output from the voltage-controlled oscillator circuit and performing a frequency acquisition operation for adjusting the frequency of the signal to a desired locking frequency;
    a tuning circuit, connected to the loop circuit to receive the signal output, for performing tuning so that the oscillation frequency approaches the locking frequency, by modulating the capacitance value of the capacitor of the voltage-controlled oscillator circuit prior to the frequency acquisition operation; and
    a reference potential application circuit for selectively applying a reference potential to the variable capacitor element of the voltage-controlled oscillator circuit during the tuning operation performed by the tuning circuit, the reference voltage application circuit is configured to switch between two types of electrical potentials to be applied to the variable capacitor element of the voltage-controlled oscillator circuit during the tuning operation.

2. A PLL frequency synthesizer circuit integrated on a semiconductor integrated circuit, comprising:
    a voltage-controlled oscillator circuit provided with a capacitor, an inductor, and a variable capacitor element for oscillating using the resonance frequencies of the capacitor and inductor, for outputting the oscillation frequency signal of a variable capacitor element;
    a negative feedback loop circuit configured to comprise the voltage-controlled oscillator circuit, capable of looping the signal output from the voltage-controlled oscillator circuit and performing a frequency acquisition operation for adjusting the frequency of the signal to a desired locking frequency;
    a tuning circuit for performing tuning so that the oscillation frequency approaches the locking frequency, by modulating the capacitance value of the capacitor of the voltage-controlled oscillator circuit prior to the frequency acquisition operation; and
    a reference potential application circuit for applying a reference potential to the variable capacitor element of the voltage-controlled oscillator circuit during the tuning operation performed by the tuning circuit, wherein an element is used as the variable capacitor element having characteristics such that the voltage range in which the capacitor characteristics of the variable capacitor element vary in linear fashion is narrower than the absolute value of the voltage applied to the second terminal from the first terminal of the variable capacitor element.

3. The PLL frequency synthesizer circuit according to claim 2, wherein a MOS capacitor is used as the variable capacitor element.

4. A PLL frequency synthesizer circuit integrated on a semiconductor integrated circuit, comprising:
    a voltage-controlled oscillator circuit provided with a capacitor, an inductor, and a variable capacitor element for oscillating using the resonance frequencies of the capacitor and inductor, for outputting the oscillation frequency signal of a variable capacitor element;
    a negative feedback loop circuit configured to comprise the voltage-controlled oscillator circuit, capable of looping the signal output from the voltage-controlled oscillator circuit and performing a frequency acquisition operation for adjusting the frequency of the signal to a desired locking frequency;
    a tuning circuit for performing tuning so that the oscillation frequency approaches the locking frequency, by modulating the capacitance value of the capacitor of the voltage-controlled oscillator circuit prior to the frequency acquisition operation; and
    a reference potential application circuit for applying a reference potential to the variable capacitor element of the voltage-controlled oscillator circuit during the tuning operation performed by the tuning circuit, wherein when the frequency variation amount of a step by which the oscillation frequency is switched by adjustment of the capacitance value is fvco_and the variation range of the oscillation frequency by voltage control is Δfvco, then the value of fvco_is set such that the following condition is satisfied:

$$fvco\_step \leq \Delta fvco/4.$$

5. The PLL frequency synthesizer circuit according to claim 1, wherein the two types of electrical potentials are each fixed potentials.

6. The PLL frequency synthesizer circuit according to claim 1, wherein each of the two types of electrical potentials is set to a value at which the C-V characteristics of the variable capacitor element are saturated.

7. The PLL frequency synthesizer circuit according to claim 6, wherein each of the two types of electrical potentials is set to a value at which the C-V characteristics of the variable capacitor element are saturated even if the C-V characteristics of the variable capacitor element fluctuate due to manufacturing variation.

8. The PLL frequency synthesizer circuit according to claim 1, wherein one of the two types of electrical potentials is a power supply potential, and the other is a ground potential.

9. The PLL frequency synthesizer circuit according to claim 1, wherein the tuning circuit is configured so as to execute:
- a first tuning operation for applying one of the two types of electrical potentials to the variable capacitor element of the voltagecontrolled oscillator circuit; and a second tuning operation for applying the other of the two types of electrical potentials to the variable capacitor element of the voltage-controlled oscillator circuit.

10. A PLL frequency synthesizer circuit integrated on a semiconductor integrated circuit, comprising:
- a voltage-controlled oscillator circuit provided with a capacitor, an inductor, and a variable capacitor element for oscillating using the resonance frequencies of the capacitor and inductor, for outputting the oscillation frequency signal of the variable capacitor element;
- a negative feedback loop circuit configured to comprise the voltage-controlled oscillator circuit, capable of looping the signal output from the voltage-controlled oscillator circuit and performing a frequency acquisition operation for adjusting the frequency of the signal to a desired locking frequency;
- a tuning circuit, connected to the loop circuit to receive the signal output, for performing tuning so that the oscillation frequency approaches the locking frequency, by modulating the capacitance value of the capacitor of the voltage-controlled oscillator circuit prior to the frequency acquisition operation; and
- a reference potential application circuit for applying a reference potential to the variable capacitor element of the voltage-controlled oscillator circuit during the tuning operation performed by the tuning circuit, wherein the voltage-controlled oscillator circuit is provided with a plurality of capacitors,
- wherein the tuning circuit modulates the capacitance value used in the generation of the resonance frequency, by selecting any of the capacitors from among the plurality of capacitors.

11. The PLL frequency synthesizer circuit according to claim 10, wherein the tuning circuit retrieves a first setting value for the capacitance value at which the oscillation frequency most closely approaches the locking frequency by modulating the capacitance value used in the generation of the resonance frequency in the first tuning operation performed in a state in which the potential applied to the variable capacitor element is set to one of the two potentials.

12. The PLL frequency synthesizer circuit according to claim 11, wherein the tuning circuit retrieves a second setting value for the capacitance value at which the oscillation frequency most closely approaches the locking frequency by modulating the capacitance value used in the generation of the resonance frequency in the second tuning operation performed in a state in which the potential applied to the variable capacitor element is set to the other of the two potentials.

13. The PLL frequency synthesizer circuit according to claim 12, wherein the tuning circuit performs a third tuning operation for setting the capacitance value used in the generation of the resonance frequency to a third setting value that is near the midpoint between the first and second setting values, and completes the tuning operation.

14. A method for tuning the oscillation frequency of a PLL frequency synthesizer circuit comprising: a voltage-controlled oscillator circuit provided with a capacitor, an inductor, and a variable capacitor element for oscillating using the resonance frequencies of the capacitor and inductor, for outputting the oscillation frequency signal of a variable capacitor element; and a negative feedback ioop circuit configured to comprise the voltage-controlled oscillator circuit, capable of looping the signal output from the voltagecontrolled oscillator circuit and performing a frequency acquisition operation for adjusting the frequency of the signal to a desired locking frequency; the frequency tuning method for a PLL frequency synthesizer circuit, the method comprising:
- performing a first tuning such that the oscillation frequency approaches the locking frequency, by modulating the capacitance value of the capacitor of the voltage-controlled oscillator circuit in a state in which one of two types of electrical potentials is applied to the variable capacitor element of the voltage-controlled oscillator circuit; and
- performing a second tuning such that the oscillation frequency approaches the locking frequency, by modulating the capacitance value of the capacitor of the voltage-controlled oscillator circuit in a state in which the other of the two types of electrical potentials is applied to the variable capacitor element of the voltage-controlled oscillator circuit, these steps being performed prior to the frequency acquisition operation.

15. The frequency tuning method for a PLL frequency synthesizer circuit according to claim 14, further comprising a step of retrieving a first setting value for the capacitance value at which the oscillation frequency most closely approaches the locking frequency when the first tuning is executed, and a step of retrieving a second setting value for the capacitance value at which the oscillation frequency most closely approaches the locking frequency when the second tuning is executed.

16. The frequency tuning method for a PLL frequency synthesizer circuit according to claim 15, wherein the second tuning is initiated using the first setting value as the initial capacitance value.

17. The frequency tuning method for a PLL frequency synthesizer circuit according to claim 15, wherein prior to the frequency acquisition operation, the capacitance value used in the generation of the resonance frequency is set to a third setting value that is near the midpoint between the first and second setting values.

* * * * *